United States Patent [19]

Schmidt

[11] Patent Number: 5,343,938
[45] Date of Patent: Sep. 6, 1994

[54] METHOD AND APPARATUS FOR THERMALLY INSULATING A WAFER SUPPORT

[75] Inventor: Bryan D. Schmidt, San Antonio, Tex.

[73] Assignee: VLSI Technology, Inc., San Jose, Calif.

[21] Appl. No.: 996,447

[22] Filed: Dec. 24, 1992

[51] Int. Cl.⁵ .................................... F28F 7/00
[52] U.S. Cl. ......................... 165/80.2; 118/725; 118/728
[58] Field of Search ............... 165/80.2; 118/724, 725, 118/728

[56] References Cited

U.S. PATENT DOCUMENTS

| | | | |
|---|---|---|---|
| 4,909,314 | 3/1990 | Lamond, Jr | 118/725 |
| 4,911,812 | 3/1990 | Kudo et al. | 118/724 |
| 4,966,669 | 10/1990 | Sadamori et al. | 118/725 |
| 4,969,511 | 11/1990 | Person | 165/80.2 |
| 4,990,374 | 2/1991 | Keller et al. | 118/725 |
| 5,096,536 | 3/1992 | Cathey, Jr. | 118/724 |

Primary Examiner—A. Michael Chambers
Attorney, Agent, or Firm—Hickman & Beyer

[57] ABSTRACT

Apparatus and method for reducing heat transfer from a motor to a wafer in a spin-on coating apparatus. The interior of the wafer chuck or spindle is provided with a gap, chamber or void that is either evacuated or is filled with a selected gas or other thermal barrier having low thermal conductivity compared to the wafer chuck material or the spindle material. Optionally, the wafer chuck or the spindle may be provided with a plurality of apertures that allow the gas in the gap to flow to a region outside the wafer chuck or the spindle.

22 Claims, 4 Drawing Sheets

METHOD AND APPARATUS FOR THERMALLY INSULATING A WAFER SUPPORT

BACKGROUND OF THE INVENTION

1. Field of the Invention

This invention relates to semiconductor wafer processing, and more particularly to temperature control during wafer coating operations.

2. Background of the Technical Art

During fabrication of an integrated circuit on a semiconductor wafer, it is often necessary to coat an exposed surface of the wafer with a material such as photoresist or insulating material. Wafer coating is often accomplished by attaching the wafer to a chuck and spinning the chuck at a high speed while coating material is deposited on the wafer surface. The chuck is typically driven by a motor spindle of a drive motor. At moderate or high rotational speeds the motor and spindle tend to generate heat, and a portion of this heat can be conducted to the wafer. This can produce non-uniform temperatures on the wafer surfaces and can degrade the quality of the coating process by producing non-uniform coatings on the wafer surface.

In the prior art, the apparatus typically used to remove heat from the motor is a water jacket assembly, which circulates water around the motor to conduct heat away from the motor. However, this apparatus is difficult and expensive to retrofit into existing systems due to the space required, the plumbing required, and the maintenance required to keep it operational.

What is needed is an economical and effective approach that reduces heat transfer from the motor and motor spindle to the chuck and attached wafer to promote uniform wafer coating.

SUMMARY OF THE INVENTION

These needs are met by the present invention, which provides apparatus and method for thermally insulating a wafer from heat energy that might otherwise be transmitted from a motor spindle to a wafer chuck. The wafer chuck is preferably provided with a chamber or gap in its interior, with the gap being preferably defined by a gap plane or curved surface that is approximately perpendicular to the direction of heat transfer from the motor spindle to the wafer. The gap preferably extends across most of the wafer chuck. The gap may be evacuated or may be filled with a gas having a heat transmission coefficient that is preferably at least an order of magnitude lower than the heat transmission coefficient of the wafer chuck material. A gas contained in the gap will increase the thermal resistance of the chuck and therefore will reduce the amount of thermal energy that would otherwise be transmitted to the wafer. In an alternative embodiment, the motor spindle is provided with a chamber or gap to inhibit thermal energy from being conducted to the chuck.

In another alternative embodiment, the gap may be filled with a gas and the wafer chuck may be provided with a plurality of apertures that communicate with the gap. Heated gas flows out through the apertures and is replaced by cooler gas flowing into other apertures, thereby removing heat from the chuck.

Alternatively, liquid or solid thermal barriers can be used to fill the gap in the chuck or the motor spindle. Such a liquid or solid can be similar to the gaseous thermal barrier in that the transmission coefficient is preferably at least an order of magnitude lower than the heat transmission coefficient of the chuck or spindle material.

These and other advantages of the present invention will become apparent to those skilled in the art upon a reading of the following specification of the invention and a study of the several figures of the drawing.

DETAILED DESCRIPTION OF THE PREFERRED EMBODIMENTS

Figure 1:
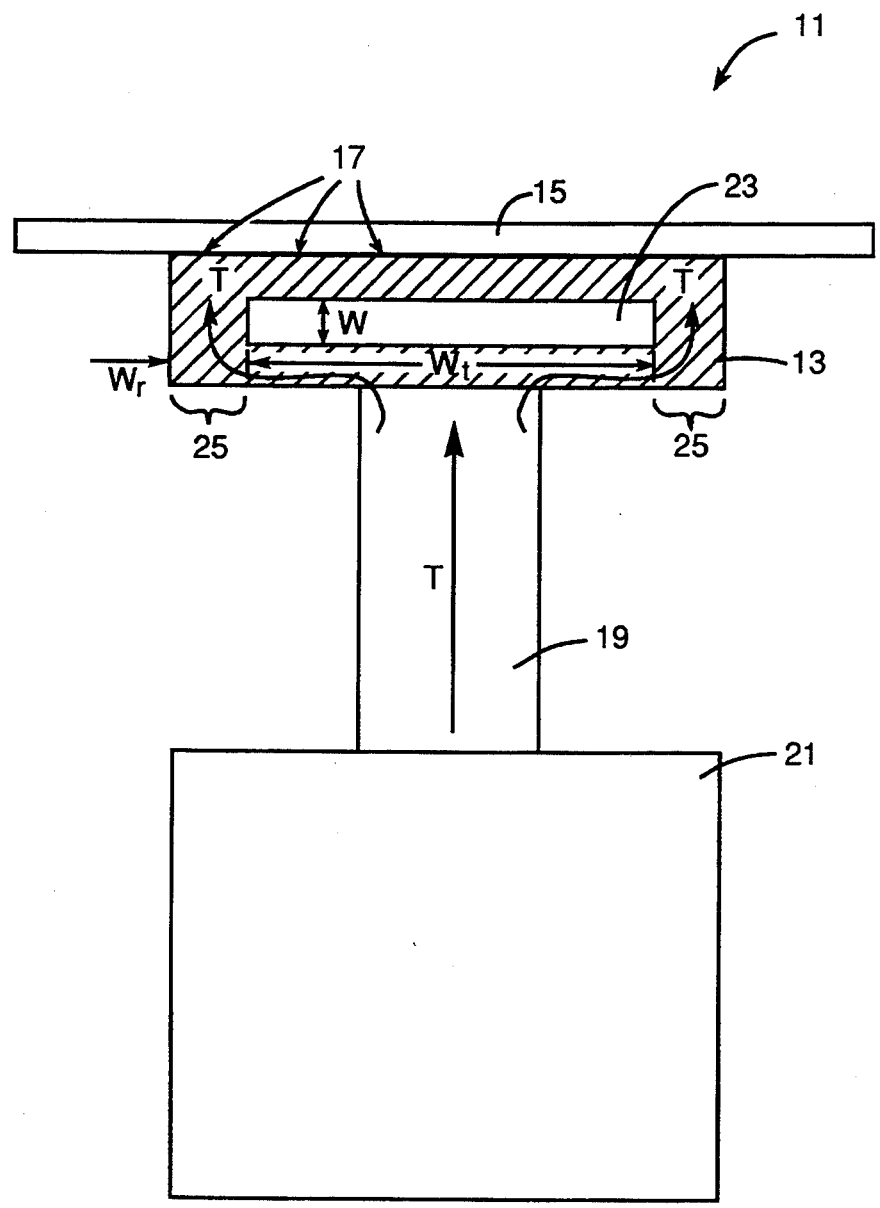
FIG. 1 is a sectional side view of an embodiment of the invention, with an insulating gap located in a wafer chuck.

FIG. 1 illustrates a first embodiment 11 of the invention. A wafer chuck 13, which can accept and hold a wafer 15 on an exposed or upper surface 17, is attached to a motor spindle 19 that is rotatingly driven by a motor 21. The wafer 15 can be held to the chuck by a variety of mechanisms, such as by clamps or a vacuum provided between the chamber and the wafer, as is well-known to those skilled in the art. The spindle 19 can be connected to the shaft of the motor, or the spindle can be the shaft of the motor itself. The chuck 13 contains a chamber or gap 23 in its interior, which is defined herein as an internal chamber or void. The gap 23 preferably extends substantially parallel to the upper surface 17 of the chuck and across the majority of the chuck width so that only a small portion 25 of the chuck material remains at the side or sides of the chuck. The wafer is attached to the chuck by conventional wafer attachment means. The diameter of the wafer chuck 13 is normally 1 to 5 inches, and the wafer chuck material is preferably teflon. The diameter of the spindle 19 is normally 1 inch and the spindle material is preferably stainless steel or aluminum. The motor 21 normally rotates the spindle 19 at a sufficiently high rpm to accomplish a desired spin-on coating process, preferably about 2000–5000 rpm. In operation, the temperature of a spindle and of the wafer 15 in the prior art might rise by several degrees.

As the motor spindle 19 turns rapidly to rotate the wafer chuck 13 and a wafer 15 held on the chuck, the motor 21 and spindle 19 tend to heat up, through friction and other losses. The thermal energy produced by the rotation of the motor spindle 19 moves by conduction as shown by the arrow T toward the cooler wafer chuck 13 and wafer 15. However, when this thermal energy reaches the gap 23 in the interior of the chuck 13, further advance by this energy is impeded by the presence of the gap 23. If the gap 23 is evacuated, the thermal conductivity across the gap is negligible, and any thermal energy transference must occur by radiation or by conduction through the small portion 25 of the chuck material remaining. However, this conductive heat transfer contribution across the small portion 25 of the chuck can be made small by proper choice of the material used for this portion 25 of the chuck and by making the remainder width $w_r$ of this portion as small as possible relative to the transverse width $w_t$ of the gap 23.

The gap 23 may be filled with a gas having much smaller thermal conductivity than the solid material of the chuck 13. For example, air at STP has a thermal conductivity of about 0.023 Watts/°K.-m, which is a factor of about 7.5 smaller than the thermal conductivity of teflon (0.173 Watts/°K.-m), a suitable wafer chuck material. Suitable gases for filling the gap 23 and the gas thermal conductivities at STP are set forth in Table 1. For most gases, thermal conductivity rises linearly but slowly with increasing temperature.

TABLE 1

| Gas Thermal Conductivities | |
|---|---|
| Gas | Thermal Cond. at STP |
| He | 0.139 Watts/°K.-m |
| Ne | 0.045 |
| Ar | 0.016 |
| CO | 0.023 |
| $N_2$ | 0.024 |
| Air | 0.023 |

Figure 2:
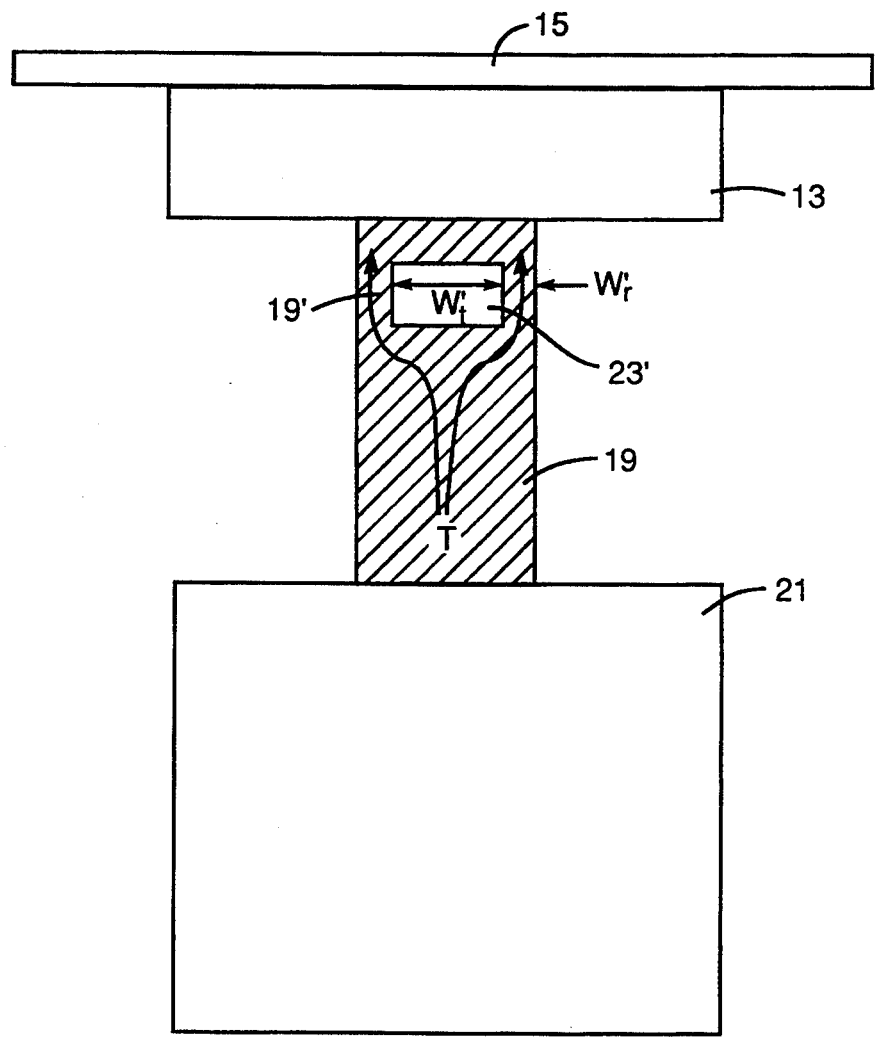
FIG. 2 is a sectional side view of an embodiment of the invention, with an insulating gap located in a spindle.

As seen in FIG. 2, a gap 23' can alternatively be positioned in the motor spindle 19, leaving a small portion 19' of the spindle material at the spindle circumference to maintain the structural integrity of the spindle. This configuration, while helpful, may be less satisfactory than the embodiment of FIG. 1, for two reasons. First, the thermal conductivity of the metal comprising spindle 19 is much greater than the thermal conductivity of the teflon material of chuck 13, permitting greater heat flow around the gap 23'. Second, the ratio of the transverse width $w_r$ of the remaining spindle material to the transverse width $w_t$ of the gap 23' in the spindle 19 is greater than the ratio of the width $w_r$ of the remaining teflon material to the transverse width $w_t$ of the gap 23 in the chuck 13. This also produces greater heat flow through the spindle 19' as shown by the arrows T. This greater heat flow can be reduced by using a spindle material with lower thermal conductivity, or by increasing the longitudinal height of the gap 23' (see FIG. 3).

Figure 3:
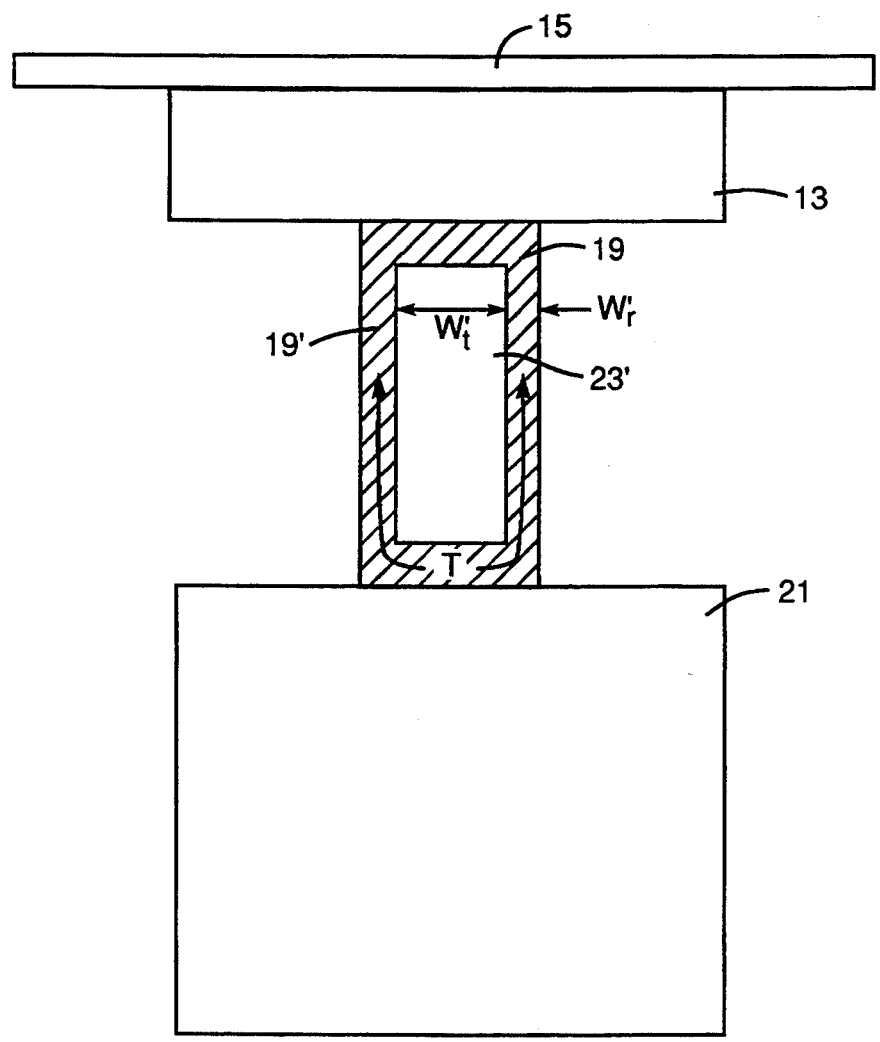
FIG. 3 is a sectional side view of an embodiment of the invention, with an elongated insulating gap located in the spindle.

FIG. 3 is an alternate embodiment of the invention shown in FIG. 2 where the gap 23' in the spindle 19 is elongated vertically along the axis of the spindle. This embodiment provides a larger area in the gap 23' for the gas to fill, and thus is more effective in impeding thermal energy from conducting to the chuck and wafer. Of course, structurally sound materials must be used for the spindle 19, especially in the side portions 19' to maintain the structural integrity of the spindle.

In an alternate embodiment, the gap 23 or 23' can be filled with a liquid or a solid thermal barrier, such as manganin. Such a barrier should have a small thermal conductivity relative to the chuck or spindle material so that thermal energy generated by the motor is impeded as in the previous embodiment.

Figure 4:
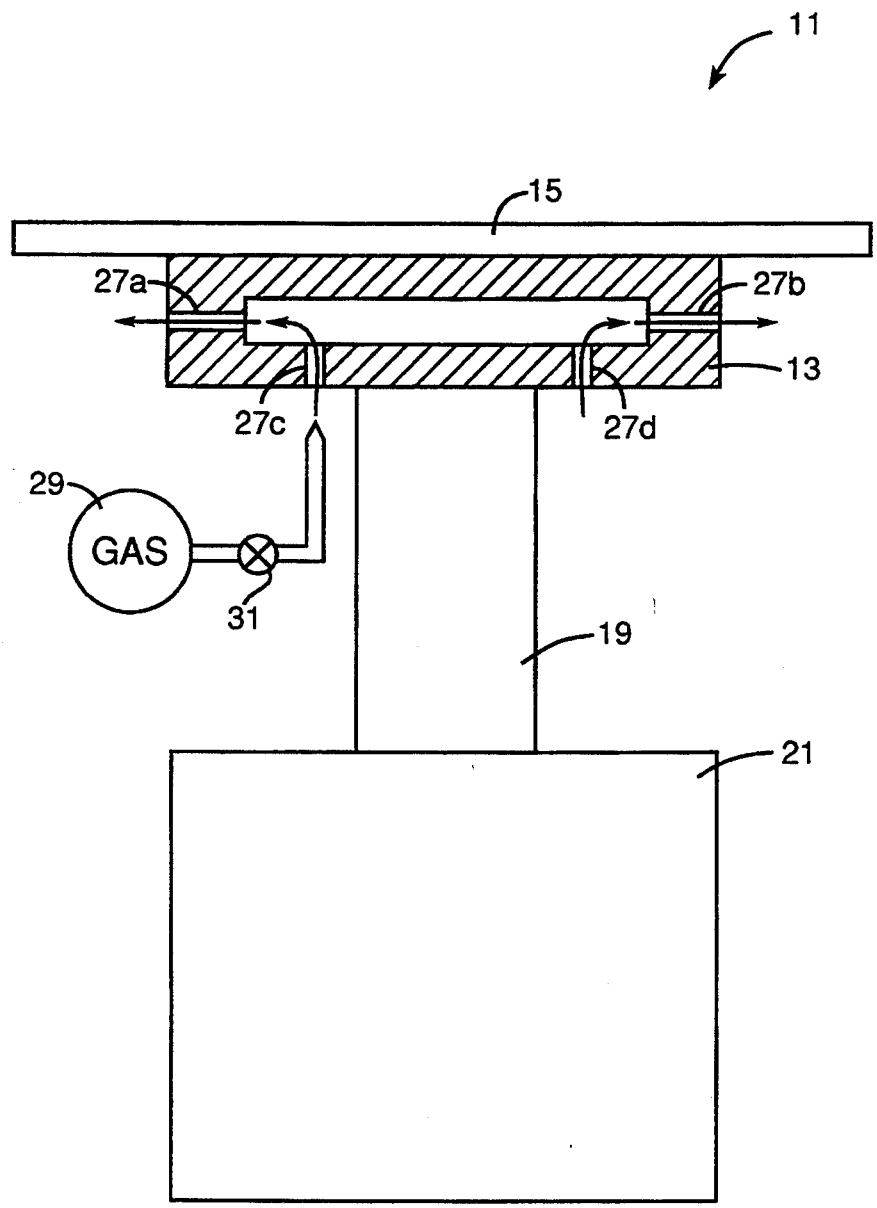
FIG. 4 is a sectional side view of another embodiment of the invention, wherein a gas may flow through a temperature-compensating gap.

FIG. 4 illustrates a sectional side view of another embodiment of the invention, wherein the wafer chuck 13 of FIG. 1 is provided with a plurality of apertures 27a, 27b, 27c, 27d that allow communication of gas in the gap 23 of the chuck with the ambient gas region outside the chuck 13. As the gas in the gap 23 becomes heated through absorption of thermal energy conducted from the motor spindle, the gas pressure rises and a portion or all of this gas moves out of the gap to a region outside the chuck 13 through apertures 27a and 27b due to the difference in pressures of the gap and the outside region and also the centrifugal force created by the spinning chuck. As the gas moves out of the gap, it removes heat energy from the chuck and cooler gas from outside the chuck 13 moves through the apertures 27c and 27d into the gap 23, and the gas heating/gas flow process is repeated. In one embodiment, the cooler gas is provided by the ambient gas region outside the chuck 13. Alternatively, a source 29 of gas with a shut off valve 31 can be provided to communicate with the gap 23 via apertures 27c, 27d, etc. to provide pressurized gas to carry heat away from the chuck. The gas source 29 can include air, nitrogen or other relatively benign cooling gasses.

With the embodiment shown in FIG. 4, the gap gas may be used to remove heat from the wafer chuck or from the spindle, depending upon where the gap 23 or 23' is located. In this instance, a gas with a relatively high heat transfer coefficient or relatively high thermal conductivity is preferable. For example, a gas such as He, with a high thermal conductivity of almost 0.14 Watts/°K.-m, is attractive here. This embodiment can also be used with fluids such as liquids, such as water, that preferably have a high heat transfer coefficient or relatively high thermal conductivity.

The use of any of the three embodiments of the invention described above reduce the amount of thermal energy conducted from the motor and/or motor spindle to the chuck. This heat transfer reduction will in turn reduce the temperature nonuniformity of the chuck and attached wafer.

While this invention has been described in terms of several preferred embodiments, it is contemplated that alterations, modifications and permutations thereof will become apparent to those skilled in the art upon a reading of the specification and study of the drawings. It is intended that the following appended claims include all such alterations, modifications and permutations as fall within the spirit and scope of the present invention.

I claim:

1. A method for controlling heat transfer to a wafer from a motor that causes rotation of the wafer, the method comprising the steps of:
   providing a wafer chuck having a water support surface that can support a wafer for rotation;
   providing a motor means having a spindle coupled to said wafer chuck, said spindle being adapted to rotate the wafer chuck around a spindle axis; and
   providing a fully enclosed internal gap within at least one of the wafer chuck and the spindle that inhibits heat conduction from the motor to the wafer, such that there is substantially no fluid communication between said gap and a space between said wafer and said wafer support surface.

2. The method of claim 1, further comprising the steps of providing said gap as a closed region and evacuating substantially all gas from said gap.

3. The method of claim 1, further comprising the step of providing a gas in said gap, where said gap gas is selected from the group of gases consisting essentially of helium, neon, argon, carbon monoxide, nitrogen and air.

4. The method of claim 3, further comprising the step of providing at least one of the wafer chuck and the spindle with a plurality of apertures communicating with said gap that allow said gap gas to flow out of said gap to a region external to said wafer chuck and said spindle.

5. The method of claim 4, further comprising the step of providing a source for said gap gas that communicates with said gap to provide said gap gas for said gap.

6. The method of claim 1, further comprising the step of providing said gap in said wafer chuck.

7. The method of claim 6, further comprising the step of positioning said gap so that said gap extends across a majority of the interior of said wafer chuck in a direction approximately perpendicular to the direction of maximum heat flow within said wafer chuck.

8. The method of claim 1, further comprising the step of providing said gap in said spindle.

9. The method of claim 8, further comprising the step of positioning said gap so that said gap extends across a majority of the interior of said spindle in a direction approximately perpendicular to the direction of maximum heat flow within said spindle.

10. The method of claim 1, further comprising the steps of providing said gap in said wafer chuck and providing said gap in said spindle.

11. A wafer support comprising:
a wafer chuck provided with a wafer support surface for supporting a wafer;
motor means;
spindle means coupling said motor means to the wafer chuck, for rotating the wafer chuck around a selected axis of said spindle means; and
thermal barrier means comprising a gap, positioned within at least one of the wafer chuck and the spindle means, said gap being separated from said wafer by material of said wafer chuck such that there is substantially no fluid communication between said gap and surface of said wafer that is proximate to said wafer support surface, for reducing the conduction of heat produced by said motor means and said spindle means in the direction of the wafer chuck.

12. The apparatus of claim 11, wherein said gap is evacuated.

13. The apparatus of claim of 11, wherein said gap contains a gas selected from the group of gases consisting of helium, neon, argon, carbon monoxide, nitrogen and air.

14. The apparatus of claim 13, wherein said gas flows through said gap.

15. The apparatus of claim 11, wherein said chuck has a plurality of apertures communicating with said gap that allow a selected fluid to flow out of said gap to a region external to said chuck.

16. The apparatus of claim 15, wherein said selected fluid is chosen to have a relatively high heat transfer coefficient.

17. The apparatus of claim 11, wherein said gap extends across a majority of the interior of said wafer chuck in a direction approximately parallel to a plane lying in said wafer chuck support surface.

18. The apparatus of claim 11, wherein said gap extends across a majority of the interior of said wafer chuck in a direction approximately perpendicular to the direction of maximum heat flow within said wafer chuck.

19. The apparatus of claim 11, wherein said gap extends across a majority of the interior of said spindle in a direction approximately parallel to a plane lying in said wafer chuck support surface.

20. The apparatus of claim 11, wherein said gap extends across a majority of the interior of said spindle in a direction approximately perpendicular to the direction of maximum heat flow within said spindle.

21. The apparatus of claim 11, wherein said gap contains a liquid having a relatively low heat transfer coefficient.

22. The apparatus of claim 11, wherein said gap contains a solid having a relatively low heat transfer coefficient.

* * * * *